United States Patent [19]

Kokubo et al.

[11] Patent Number: 4,672,361
[45] Date of Patent: Jun. 9, 1987

[54] LINEAR INTERPOLATIVE ANALOG-TO-DIGITAL CONVERTER

[75] Inventors: Masaru Kokubo; Shigeo Nishida, both of Kokubunji; Kazuo Yamakido, Nishitama, all of Japan

[73] Assignee: Hitachi, Ltd., Tokyo, Japan

[21] Appl. No.: 769,310

[22] Filed: Aug. 26, 1985

[30] Foreign Application Priority Data

Sep. 7, 1984 [JP] Japan .................. 59-186318

[51] Int. Cl.[4] .................. H03M 3/02
[52] U.S. Cl. .................. 340/347 AD; 332/11 D; 375/28
[58] Field of Search .................. 375/27-32; 340/347 AD, 347 C; 332/11 D

[56] References Cited

U.S. PATENT DOCUMENTS 3,541,446 11/1970 Prozeller .................. 340/347 NT
4,271,431 6/1981 Steber .................. 375/27 X Primary Examiner—T. J. Sloyan
Attorney, Agent, or Firm—Antonelli, Terry & Wands

[57] ABSTRACT

Disclosed is an interpolative A/D converter for converting an over-sampled analog signal into a digital signal without the occurrence of over slope distortions, wherein the difference between the analog input signal and an analog feedback signal derived from the converter output through D/A conversion is integrated, the integrated output is compared with several reference voltages and, after being converted into a digital signal, the comparison result is integrated in a digital manner to complete a digital output signal of the A/D converter.

6 Claims, 8 Drawing Figures

| $E_1$ | $E_2$ | $b_0 \sim b_7$ | CODE |
|---|---|---|---|
| L | L | 0 0 0 0 0 1 0 0 | 4 |
| L | H | 0 0 0 0 0 0 0 1 | 1 |
| H | H | 1 1 1 1 1 1 1 1 | −1 |
| H | L | 1 1 1 1 1 1 0 0 | −4 |

FIG. 4
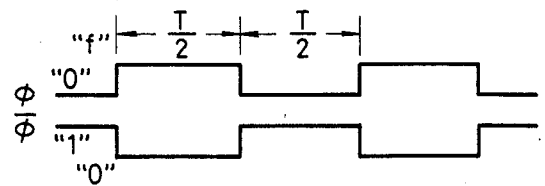
FIG. 5
| D₁ | D₂ | D₃ | b₀ ~ b₇ | CODE |
|---|---|---|---|---|
| L | L | L | 00000100 | 4 |
| L | H | L | 00000001 | 1 |
| H | H | L | 11111111 | -1 |
| H | H | H | 11111100 | -4 |
FIG. 6
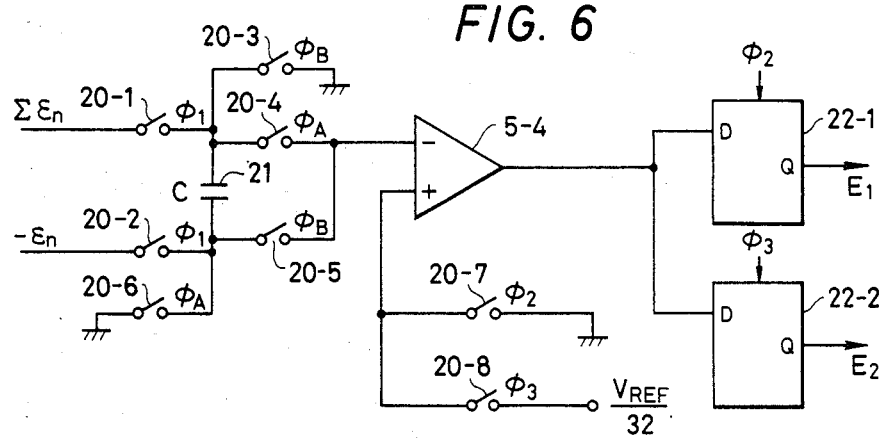
FIG. 7
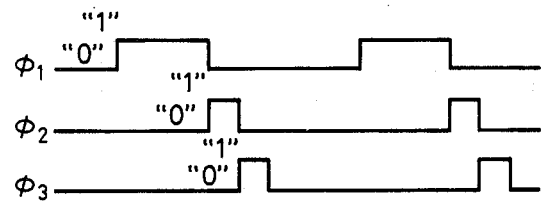

LINEAR INTERPOLATIVE ANALOG-TO-DIGITAL CONVERTER

BACKGROUND OF THE INVENTION (1) Field of the Invention

This invention relates to an A/D converter and, more particularly, to an interpolative A/D converter in which the difference between the analog input signal and a local D/A converted signal is integrated, the integrated analog signal is quantized using comparators into a digital signal, and the digital signal is integrated to yield the digital output signal and at the same time provide the local D/A converted signal.

(2) Description of the Prior Art

An interpolative A/D converter takes advantage of accurate A/D conversion using a relatively simple circuit arrangement. However, when the input signal level varies at a high rate to create an increasing difference from the local D/A converted signal (approximate feedback signal), the difference between the integrated value and the quantized level increases, resulting in a problem of "over slope". To cope with this problem a nonlinear interpolative A/D converter is known in which the quantization level of the comparator is varied exponentially in response to the analog input level, as disclosed in U.S. Pat. No. 3,932,864 by James Charles Candy. This nonlinear interpolative A/D converter, with the quantized feedback signal level varying exponentially, unfavorably has the quantization noise power of the signal greatly dependent on the input signal level. Namely, when the A/D converter is given an input offset voltage, which acts apparently as an increased input signal level, the quantization noise power increases, resulting in the impairment of the S/N ratio. A conceivable method to overcome this problem is the provision of a high-pass filter for eliminating the offset voltage in front of the A/D converter. However, the filter needs to have a low cutoff frequency so that the attenuation of the audio band signal above 300 Hz is negligibly small, requiring a large capacitance and resistance for the components, and it is extremely difficult for the A/D converter to be fabricated in LSI.

Also known is an interpolative A/D converter intended to get rid of a great dependency of the quantization noise power on the input level by linearizing the feedback signal, as described in the Proceedings of the National Convention of the Institute of Electronics and Communication Engineerings of Japan, 1984. This A/D converter produces a feedback signal through the application of the comparator output to the analog integration circuit through the 1-bit D/A converter and attenuator, and accurate A/D conversion is implemented by averaging the comparator output in a digital manner. The approximate feedback analog signal is quantized by a constant parameter independent of the input signal level, whereby the quantization noise power is made constant. The linear interpolative A/D converter, however, needs to have a sufficiently high sampling frequency in order to avoid the over slope distortion, e.g., a sampling frequency of 2 MHz or above is required for the input signal with a bandwidth of 4 kHz or less.

When it is intended to fabricate the above A/D converter in LSI, there arise problems of increased clock noise and power dissipation of operational amplifiers due to the fast operation at 2 MHz. In addition, when MOS transistors, which are common in LSI fabrication, are used to form the analog integration circuit and feedback circuit, clock feedthrough noise voltages created by the switches and an offset voltage created by the 1-bit D/A converter are integrated by the integrator, resulting eventually in a significant offset voltage level, and therefore it will be difficult for the device to implement accurate A/D conversion which meets a stringent specification on the S/N ratio (e.g., 90 dB) as required, for example, by digital switching systems.

SUMMARY OF THE INVENTION

Accordingly, it is an object of this invention to provide an interpolative A/D converter which is free from over slope distortions at a low sampling frequency of around 1 MHz, and yet renders the quantization noise power independent of the input signal level.

In order to achieve the above objective, this invention resides in an interpolative A/D converter in which the difference between the input signal and a local D/A converted signal is integrated and then compared with more than one reference voltage, and the result of comparison is digitized and then integrated by a digital integration circuit to produce the digital output signal. The inventive A/D converter provides, in principle, a constant quantization level independent of the input signal level, thereby achieving the linear S/N characteristics for the input signal ranging from a low level to a high level. The quantization level is changed only when a lowered sampling frequency (around 1 MHz) could cause over slope so as to ensure accurate A/D conversion. On this account, the foregoing prior art problem in fabricating the A/D converter in LSI is solved.

These and other features and advantages of this invention will become more apparent from the following detailed description taken in conjunction with the accompanying drawings.

BRIEF DESCRIPTION OF THE DRAWINGS

FIG. 4 is a waveform diagram showing the timing signals used in the arrangement of FIG. 2;

FIG. 5 is a table showing the encoding rule of the logic circuit shown in FIG. 2;

FIG. 6 is a schematic diagram showing an embodiment of the comparator used in the inventive A/D converter;

FIG. 7 is a waveform diagram showing the timing signals used in the circuit arrangement of FIG. 6.

DESCRIPTION OF THE PREFERRED EMBODIMENT

Figures 1, 8:
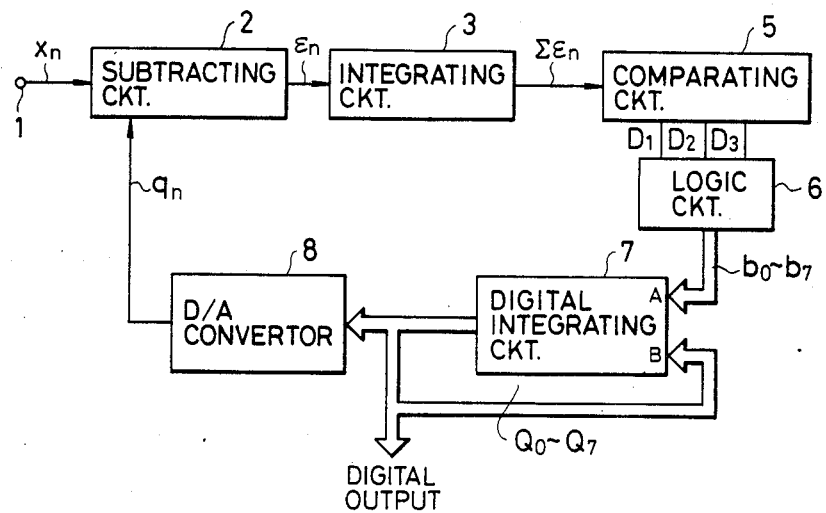
FIG. 1 is a block diagram showing the A/D converter embodying the present invention.
FIG. 8 is a table showing the code conversion rule applied to the circuit arrangement of FIG. 6.

In FIG. 1 showing in block form an embodiment of the inventive A/D converter, an analog input signal $x_n$ to be converted is introduced through the input terminal 1 to the subtraction circuit 2. The subtraction circuit 2 provides the difference $\epsilon_n$ between the input signal $x_n$ and a local A/D converted signal $q_n$ which is a feedback of the digital output signal, and the difference ($\epsilon_n = x_n - q_n$) is fed to the integration circuit 3, which delivers its output to the comparison circuit 5. The comparison circuit 5 compares its input with several reference values and produces a corresponding number of outputs D1, D2 and D3. The logic circuit 6 encodes the comparator outputs D1, D2 and D3 into a digital signal made up of eight bits b0~b7. The digital integration circuit 7 receives the output b0~b7 from the logic circuit 6 and provides the integrated bit outputs Q0~Q7 which is the output of the A/D converter. The digital output Q0~Q7 is further converted into an approximate analog signal by the D/A conversion circuit 8 and fed back as the local D/A converted signal $q_n$ to the subtraction circuit 2.

Accordingly, the output of the comparator 5 is encoded depending on its input level, and the resultant digital signal b0~b7 is added to the A/D conversion output Q0~Q7 before the digital integration process which yields the A/D conversion output Q0~Q7. The digital signal b0~b7 produced by the comparator 5 and logic circuit 6 normally has a certain magnitude as provided by the comparator in the usual linear feedback A/D converter, and the magnitude is increased by several times only when over slope would arise due to a relatively low sampling frequency around 1 MHz. The digital integration circuit 7 is arranged by a full adder for adding the digital signals b0~b7 and Q0~Q7 and a shift register.

Figure 2:
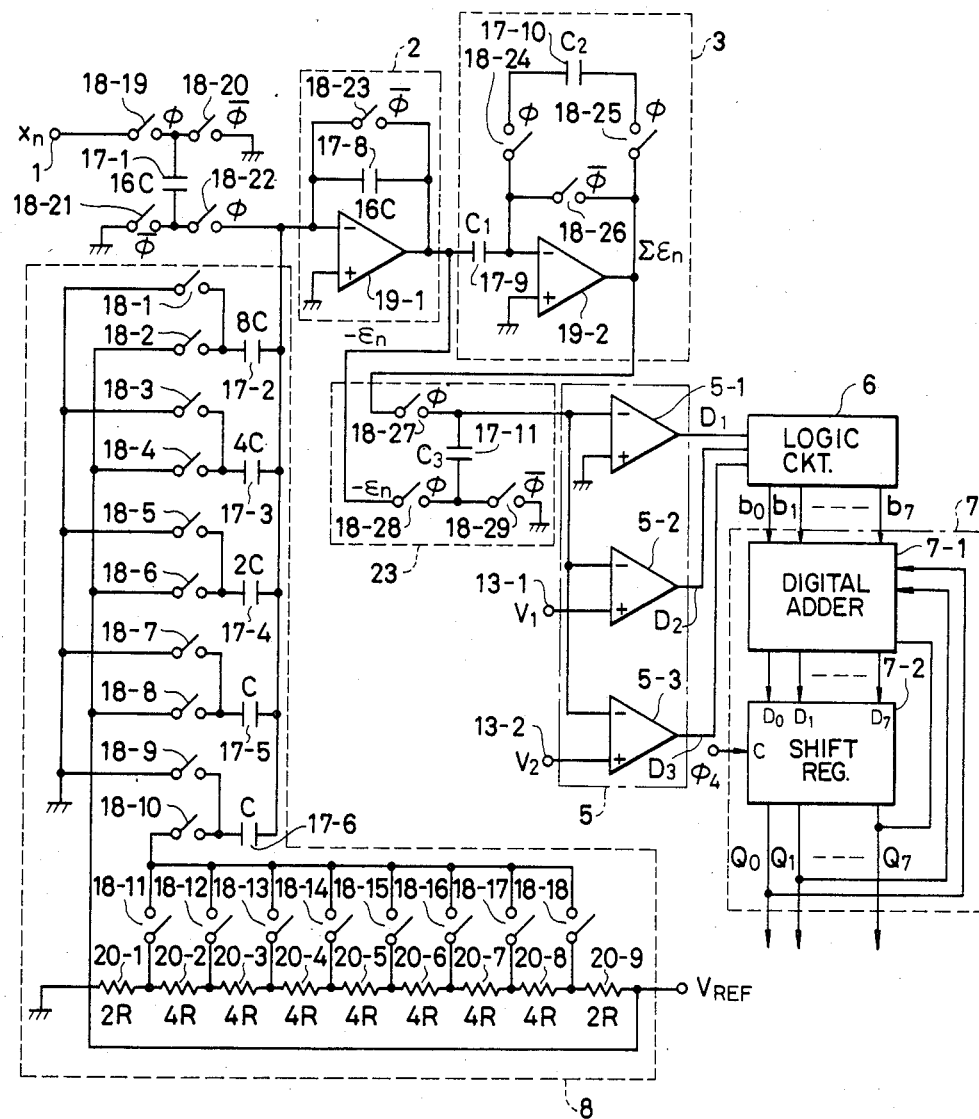
FIG. 2 is a schematic diagram of the above embodiment.

FIG. 2 shows the details of the circuit arrangement, in which portions corresponding to the functional blocks of FIG. 1 are referred to by the same symbols. In the figure, switches having symbol $\phi$ or $\bar{\phi}$ are driven by a complementary timing signal $\phi$ or $\bar{\phi}$ of 1 MHz shown in FIG. 4, and each switch closes or opens in response to a "1" level or "0" level of the drive signal.

Figure 3:
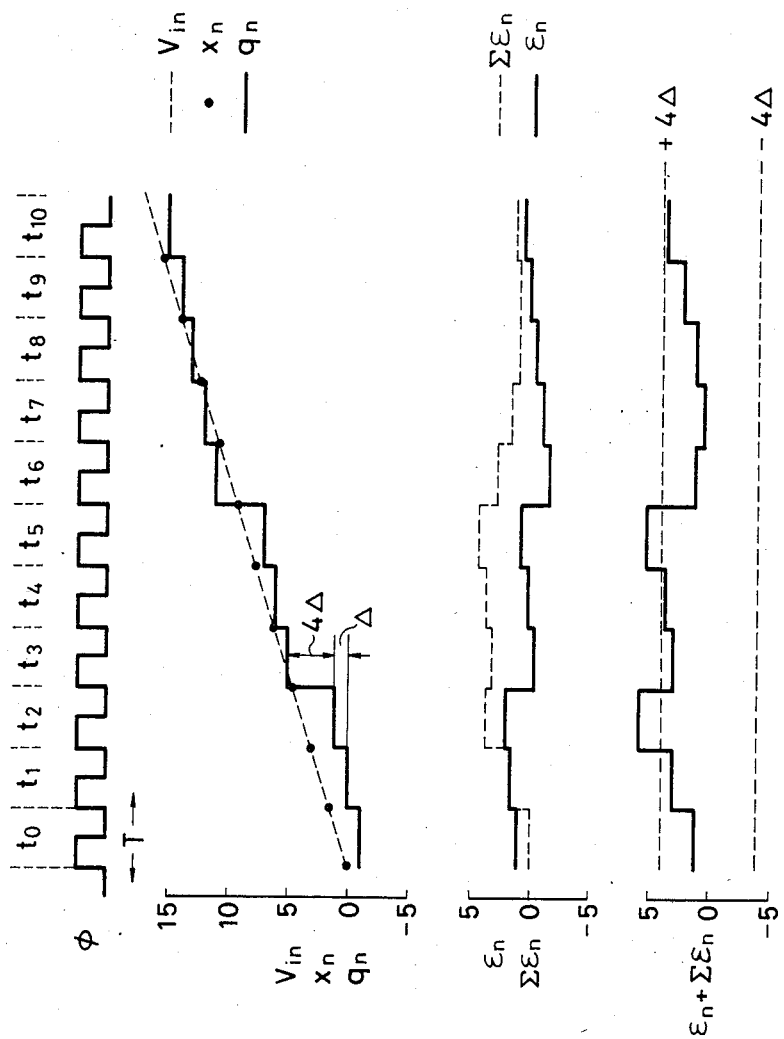
FIG. 3 is a set of waveform diagrams used to explain the operation of the inventive A/D converter.

FIG. 3 shows the waveforms of signals observed at various portions of the circuit shown in FIG. 2. The input signal $V_{in}$ entered through the input terminal 1 is sampled by the switches 18-19 and 18-22 and the capacitor 17-1 in the initial period T/2 to become a sample signal $x_n$, and its polarity-inverted signal is applied to the negative input terminal of the operational amplifier 19-1. The negative terminal of the amplifier 19-1 is also connected to the output of the D/A converter 8, so that the difference of the input signal $-x_n$ and the D/A converter output, i.e., $-x_n+q_n$, is produced at the D/A converter output terminal, and it is supplied to the analog integration circuit 3 consisting of an operational amplifier 19-2 and capacitors 17-9 and 17-10. The output of the integration circuit 3 is expressed as $$\sum_{i}^{n} \epsilon_i.$$

In operation, when the timing signal $\bar{\phi}$ is "1", the negative input terminal of the amplifier 19-2 has the same voltage as that of the positive input terminal (ground voltage), causing the integrator to be reset, and when the timing signal $\phi$ is "1", the amplifier provides output $-\epsilon_n$, charging the capacitor 17-10 in proportion to this output voltage, resulting in the output of the amplifier 19-2 to be $$\sum_{i}^{n} \epsilon_i.$$

The output of the integration circuit 3 is added to the output of the subtracter 2 by the adding circuit 23 made up of switches 18-27 and 18-28 and a capacitor 17-11, which provides output $$\epsilon_n + \sum_{i=-\infty}^{n} \epsilon_i.$$

In the latter half cycle T/2 of the timing signal, $\phi$ becomes "0" and $\bar{\phi}$ becomes "1", causing the switches 18-19, 18-22, 18-24, 18-25, 18-27, and 18-28 to open, and the switches 18-20, 18-21, 18-23, 18-26, and 18-29 to close. Then, the capacitors 17-1 and 17-8 discharge, the capacitor 17-10 holds the integrated value, and the capacitor 17-11 provides an input signal to be compared with the reference values by the comparison circuit 5. The comparison circuit 5 is a parallel connection of three comparators 5-1, 5-2 and 5-3, receiving reference voltages of 0 volt, $V_1$ (at terminal 13-1) and $V_2$ (at terminal 13-2), respectively. It is desirable to set the reference voltages $V_1$ and $V_2$ so that the integrated value $$\epsilon_n + \sum_{i}^{n} \epsilon_i$$

will approach zero in the next sampling period. In this embodiment, these values are set to positive and negative values with a magnitude four times the minimum quantization level of the D/A converter 8, i.e., 1/32 of the maximum quantization level.

The comparators 5-1, 5-2 and 5-3 in the comparison circuit 5 provide output signals $D_1$, $D_2$ and $D_3$, respectively, for the logic circuit 6, which produces a digital signal in a bit string b0~b7 in correspondence to the combination of the outputs $D_1$, $D_2$ and $D_3$ each having a value of "high" or "low" as shown in FIG. 5. Accordingly, the comparison circuit 5 and logic circuit 6 in combination constitute an encoder for the analog integrated value. The logic circuit 6 normally (when over slope does not occur) produces a digital signal of small magnitude, i.e., '00000001' (decimal +1) or '11111111' (decimal −1), but if over slope is expected with such a small digital signal, e.g., when the signals $D_1$, $D_2$ and $D_3$ are all "low" or "high", it produces a digital signal of '00000100' (decimal +4) or '11111100' (decimal −4). The logic circuit 6 for implementing the coding rule as shown in FIG. 5 can readily be arranged, and further explanation thereof is not described here.

The digital signal b0~b7 is supplied to the digital adder 7-1 which consists of eight full adders corresponding to the eight bits b0~b7, and added to the digital output signal Q0~Q7 of the A/D converter. The digital adder 7-1 has its output bits fed to the shift register 7-2. Accordingly, the digital adder 7-1 and shift register 7-2 in combination constitute a digital integration circuit, which produces an averaged digital output through the integration of digital output signals representative of sampled analog input signals.

The output of the digital integration circuit 7, after transformation of its 2's comprement representation to sign-magnitude represetation, is at the same time fed to the D/A conversion circuit 8 that produces the local D/A converted feedback signal $q_n$. The D/A conversion circuit 8 consists of resistors 20-1, 20-2, ..., and 20-9 connected in series between the reference voltage source $V_{REF}$ and ground, switches 18-11, 18-12, ..., and 18-18 for fetching divided voltages $2/32V_{REF}$, $6/32V_{REF}$, $10/32V_{REF}$, ... $26/32V_{REF}$, $30/32V_{REF}$, and $32/32V_{REF}$ from the respective nodes of the resistors and for conducting the voltages selectively to the common line, weighting capacitors 17-2, 17-3, 17-4 and 17-5 with their one ends connected commonly to the negative input terminal of the operational amplifier 19-1, switches 18-1, 18-2 and 18-8 provided at the other ends of the capacitors for connecting them to the reference voltage source $V_{REF}$ or ground selectively, a capacitor 17-6 with its one end connected to the negative input terminal of the amplifier 19-1, and switches 18-9 and 18-10 for connecting another end of the capacitor 17-6 to the common line or ground selectively.

The operation of the D/A conversion circuit 8 is as follows. Among the bits of digital output signal Q0~Q7, high-order bits Q0~Q4 (Q0: sign bit) are used to control the switches 18-1 through 18-10. Switch 18-1 or 18-2 is selected when Q1 is "1", switch 18-3 or 18-4 is selected when Q2 is "1", switch 18-5 or 18-6 is selected when Q3 is "1", and switch 18-7 or 18-8 is selected when Q4 is "1". A selected switch connected to $V_{REF}$ (18-2, 18-4, 18-6 or 18-8) is closed when the sign bit Q0 is "1" and the timing signal $\bar{\phi}$ is "1", while a selected switch connected to the ground (18-1, 18-3, 18-5 or 18-7) is closed when the sign bit Q0 is "1" and the timing signal $\phi$ is "1". With the sign bit Q0 being "0", a switch on the $V_{REF}$ side is closed when $\phi$ is "1", and a switch on the ground side is closed when $\bar{\phi}$ is "1", as opposed to the above case.

The low-order bits Q5~Q7 are used to select switches 18-11 through 18-18 corresponding to the 3-bit code. The addition of analog values is implemented by turning the switches 18-9 and 18-10 in response to the sign bit Q0 as in selecting switches 18-1 through 18-8.

Through the above switching operation, charges stored in the capacitors 17-2 through 17-6 in correspondence to bits Q0~Q7 are transferred through the virtual ground point of the operational amplifier 19-1 to the capacitor 17-8 as a D/A converted signal $q_n$. As mentioned previously, the analog signal $x_n$ is introduced with a reversed polarity through the capacitor 17-1, and by making the capacitor 17-1 to have a capacitance equal to the capacitance of 17-8 or the total capacitance of 17-2 through 17-6, a differential value $q_n - x_n$, i.e., $-\epsilon_n$, is obtained at the output terminal of the operational amplifier 19-1.

As can be seen from FIG. 3, the integrated output (output of adder 23) $\epsilon_n + \Sigma \epsilon_n$ exceeds the reference voltage $V_1$ (5 volts) at time points t2 and t5, and on this account increased $q_n$ at the respective following time points t3 and t6 alleviates the influence of over slope.

The following table lists actual values pertaining to the waveforms of FIG. 3. The value of $x_n$ is given as $x_n = 1/\Delta \cdot \sin(2\pi f_n/f_s)$ where f=2 kHz, $f_s$=1.024 MHz and $\Delta$ denotes the minimum quantization level.

TABLE

|  | $x_n$ | $q_n$ | $\epsilon_n$ | $\Sigma \epsilon_n$ | $\epsilon_n + \Sigma \epsilon_n$ |
| --- | --- | --- | --- | --- | --- |
| 0 | 0 | −1 | 1.0 | 0.0 | 1.0 |
| 1 | 1.56 | 0 | 1.56 | 1.56 | 3.12 |
| 2 | 3.12 | 1 | 2.12 | 3.67 | 5.79 |
| 3 | 4.67 | 5 | −0.33 | 3.35 | 3.02 |
| 4 | 6.23 | 6 | 0.23 | 3.58 | 3.81 |
| 5 | 7.79 | 7 | 0.79 | 4.37 | 5.16 |
| 6 | 9.34 | 11 | −1.66 | 2.71 | 1.05 |
| 7 | 10.90 | 12 | −1.10 | 1.61 | 0.50 |
| 8 | 12.45 | 13 | −0.55 | 1.05 | 0.50 |
| 9 | 14.00 | 14 | −0.00 | 1.05 | 1.05 |
| 10 | 15.55 | 15 | 0.55 | 1.60 | 2.15 |

FIG. 6 shows another embodiment of the comparison circuit used in the inventive A/D comparator, and it comprises one comparator 5-4 and a reference voltage source $V_{REF}/32$ in contrast to the previous embodiment shown in FIG. 3 using three comparators. In the arrangement the capacitor 21 is supplied with the analog integration value $\Sigma \epsilon_n$ and differential signal $-\epsilon_n$ through the switches 20-1 and 20-2, respectively, which are operated concurrently. One end of the capacitor 21 is grounded through the switches 20-3 and 20-6 and another end is connected to the negative input terminal of the comparator 5-4 through the switches 20-4 and 20-5 as shown. The comparator 5-4 has its positive input terminal grounded through the switch 20-7 or connected through the switch 20-8 to the reference voltage source $V_{REF}/32$. The output of the comparator 5-4 is delivered to the input of the D-type flip-flops 22-1 and 22-2. The switches and flip-flops are operated by the timing signals $\phi1$, $\phi2$, $\phi3$, $\phi A$ and $\phi B$ as shown. The timing signals $\phi2$ and $\phi3$ have a smaller duty cycle as compared with $\phi1$. The timing signals $\phi A$ and $\phi B$ are produced in accordance with the following logical expressions.

$$\begin{cases} \phi A = \phi 2 + \phi 3 \cdot \overline{E_1} \\ \phi B = \phi 3 \cdot E_1 \end{cases}$$

In operation, the integral value $$\sum_{i}^{n} \epsilon_i + \epsilon_n$$

is stored in the capacitor 21 when the timing signal $\phi1$ is "1". At the subsequent timing $\phi2$ the analog switches 20-6 and 20-4 are made conductive to test the polarity of the $$\epsilon_n + \sum_{i}^{n} \epsilon_i,$$

and the result is held in the register 22-1. If the polarity is found positive (E1=0), the analog switches 20-4 and 20-6 are made conductive and the reference voltage $V_{REF}/32$ is fed to the comparator 5-4 to test whether the $$\epsilon_n + \sum_{i}^{n} \epsilon_i$$

exceeds $V_{REF}/32$, and the result is held in the register 22-2. If the polarity is found negative (E1=1), the analog switches 20-3 and 20-5 are made conductive so as to exchange the terminals of the capacitor 21, and the same test operation proceeds. Using the truth table shown in FIG. 8 for the resultant signals E1 and E2, the digital signal b0~b7 is produced, and through the digital integration by the integrator 7 shown in FIG. 2 the signal Q0~Q7 for the next sampling operation is obtained.

In the above description, the signal to be compared $$\left( \epsilon_n + \sum_{i}^{n} \epsilon_i \right)$$

applied to the voltage comparator and the reference voltage can be produced using various switched capacitor circuits, and their circuit arrangements are not limited to those shown in FIGS. 2 and 6. The reference voltages $\pm V_{REF}/32$ may be produced by more finely dividing the 2R/4R resistor string shown in FIG. 2.

According to this invention, as described above, the sampling frequency can be lowered by $\frac{1}{2}$ to $\frac{1}{4}$ from the conventional 2 MHz to achieve a comparable S/N ratio without the occurrence of over slope, whereby the operational amplifiers and analog switches can have a relaxed operating speed 2~8 times slower than the conventional case, resulting advantageously in a reduced reset voltage and also reduced layout area when fabricated in LSI.

We claim:

1. An analog-to-digital converter for producing a linear interpolative digital signal in response to an input analog signal, comprising:
    subtracting means for producing a difference signal which represents the difference between said input analog signal and a feedback signal;
    integrating means coupled to said subtracting means for integrating said difference signal;
    a comparing circuit coupled to said integrating means and including first circuit means for comparing the output of said integrating means with three reference voltages and second circuit means for converting an output signal from said first circuit means to a digital signal;
    a digital integrating circuit for integrating the digital signal from said comparing circuit, including a digital adder for adding the output of said second circuit means with the output of said digital integrating circuit;
    digital-to-analog converter means for converting the output of said digital integrating circuit to said feedback signal and for supplying said feedback signal to said subtracting means; and
    output means for providing the output of said digital integrating circuit as said linear interpolative digital signal;
    said first circuit means comprising a comparator having a positive input terminal and a negative input terminal, a set of switches for conducting the output of said analog integration circuit to said negative input terminal on a time division basis, and a set of switches for conducting a ground voltage and a reference voltage to said positive input terminal on a time division basis.

2. An analog-to-digital converter for producing a linear interpolative digital signal in response to an input analog signal, comprising:
    subtracting means for producing a difference signal which represents the difference between said input analog signal and a feedback signal;
    integrating means coupled to said subtracting means for integrating said difference signal;
    a comparing circuit coupled to said integrating means and including first circuit means for comparing the output of said integrating means with three reference voltages and second circuit means for converting an output signal from said first circuit means to a digital signal;
    a digital integrating circuit for integrating the digital signal from said comparing circuit, including a digital adder for adding the output of said second circuit means with the output of said digital integrating circuit;
    digital-to-analog converter means for converting the output of said digital integrating circuit to said feedback signal for supplying said feedback signal to said subtracting means;
    output means for providing the output of said digital integrating circuit as said linear interpolative digital signal; and
    and adding circuit for adding the difference signal to the output of said integrating means, said adding circuit being located between said integrating means and said comparing circuit.

3. An analog-to-digital converter according to claim 2, wherein said comparing circuit comprises first, second and third comparing circuits each having a negative input terminal receiving the output of said integrating means and a positive input terminal and having positive input terminals receiving a ground voltage, a negative reference voltage and a positive reference voltage, respectively.

4. An analog-to-digital converter according to claim 3, wherein said negative and positive reference voltages have a magnitude four times a quantization unit voltage.

5. An analog-to-digital converter according to claim 2, wherein said comparing circuit comprises positive and negative input terminals, means having a first set of switches for supplying a ground voltage and a certain reference voltage to said positive input terminal periodically on a time division basis, and means having a second set of switches operating periodically and on a time division basis for receiving the output of said adding circuit in such a way as to provide an alternating polarity output and for supplying the alternating polarity output to said negative input terminal.

6. An analog-to-digital converter according to claim 2, wherein said integrating means comprises a first comparison circuit having a positive input terminal which is grounded and a negative input terminal connected to receive said difference signal through a first capacitor, first switch means provided between the output terminal and the negative input terminal of said first comparison circuit and operating to open and close periodically, and a second capacitor connected between the output terminal and the negative input terminal of said first comparison circuit through second and third switch means which operate to open and close in a complementary fashion with respect to each other, and wherein said adding circuit comprises fourth switch means connected between said output terminal and the input end of said first capacitor, a third capacitor, and fifth switch means, said fourth and fifth switch means operating identically to said second and third switch means.

* * * * *